(12) United States Patent
Choi et al.

(10) Patent No.: US 11,213,913 B2
(45) Date of Patent: Jan. 4, 2022

(54) LASER REFLOW APPARATUS

(71) Applicant: LASERSSEL CO., LTD., Asan-si (KR)

(72) Inventors: Jae Joon Choi, Gwangju-si (KR); Byoung Cheol Kim, Seoul (KR); Byung Roc Kim, Incheon (KR); Nam Seong Kim, Anyang-si (KR)

(73) Assignee: LASERSSEL CO., LTD., Asan-si (KR)

( * ) Notice: Subject to any disclaimer, the term of this patent is extended or adjusted under 35 U.S.C. 154(b) by 530 days.

(21) Appl. No.: 16/305,278

(22) PCT Filed: Jul. 12, 2018

(86) PCT No.: PCT/KR2018/007920
§ 371 (c)(1),
(2) Date: Nov. 28, 2018

(87) PCT Pub. No.: WO2019/017650
PCT Pub. Date: Jan. 24, 2019

(65) Prior Publication Data
US 2021/0220945 A1    Jul. 22, 2021

(30) Foreign Application Priority Data
Jul. 17, 2017 (KR) .................. 10-2017-0090589

(51) Int. Cl.
*B23K 26/06* (2014.01)
*B23K 26/073* (2006.01)
*B23K 26/08* (2014.01)
*B23K 26/20* (2014.01)

(52) U.S. Cl.
CPC ...... *B23K 26/0648* (2013.01); *B23K 26/0738* (2013.01); *B23K 26/0838* (2013.01); *B23K 26/20* (2013.01)

(58) Field of Classification Search
CPC ............ B23K 26/0648; B23K 26/0738; B23K 26/0838; B23K 26/20
USPC ....................................... 219/121.6
See application file for complete search history.

(56) References Cited

U.S. PATENT DOCUMENTS 5,227,604 A    7/1993    Freedman

FOREIGN PATENT DOCUMENTS

| JP | 11-134920 A | 5/1999 |
| JP | 11-297764 A | 10/1999 |
| JP | 2004-289084 A | 10/2004 |
| JP | 2005-178220 A | 7/2005 |

(Continued)

OTHER PUBLICATIONS

Taiwan Office Action for corresponding Taiwanese application No. 107124498 dated Jun. 21, 2019.

(Continued)

*Primary Examiner* — Dana Ross
*Assistant Examiner* — Joseph W Iskra
(74) *Attorney, Agent, or Firm* — Hauptman Ham, LLP

(57) ABSTRACT

A laser reflow apparatus capable of reducing tact time for a single bonding object, and accelerating an overall bonding process for all of a plurality of bonding objects is provided. The laser reflow apparatus comprises a bonding object transfer unit including a stage, a laser emission unit, a beam transmission plate, and a beam transmission plate transfer unit.

7 Claims, 5 Drawing Sheets

(56) References Cited

FOREIGN PATENT DOCUMENTS

| | | | |
|---|---|---|---|
| JP | 2008-153366 A | | 7/2008 |
| JP | 2010-10196 A | | 1/2010 |
| JP | 2011-171551 A | | 9/2011 |
| JP | 2012-89696 A | | 5/2012 |
| KR | H11134920 | * | 5/1999 |
| KR | 10-2005-0042582 A | | 5/2005 |
| KR | 20050042582 | * | 5/2005 |
| KR | 10-2009-0028161 A | | 3/2009 |
| KR | 20090028161 | * | 3/2009 |
| KR | 2011171551 | * | 9/2011 |
| KR | 10-1245356 B1 | | 3/2013 |
| KR | 10-2017-0048971 A | | 5/2017 |
| KR | 20170048971 | * | 5/2017 |
| KR | 10-2017-0065470 A | | 6/2017 |

OTHER PUBLICATIONS

Japanese Office Action for corresponding Japanese application No. 2018-562342 dated Jul. 2, 2019.
Japanese Office Action for corresponding Japanese application No. 2018-562342 dated Sep. 17, 2019.
Korean Office Action dated Aug. 17, 2018 in connection with the counterpart Korean Patent Application No. 10-2017-0090589.
Extended European Search Report dated Mar. 18, 2021, corresponding to European Application No. 18835546.5.

* cited by examiner

LASER REFLOW APPARATUS

CROSS REFERENCE TO RELATED APPLICATION

This present application is a national stage filing under 35 U.S.C § 371 of PCT application number PCT/KR2018/007920 filed on Jul. 12, 2018 which is based upon and claims the benefit of priority to Korean Patent Application No. 10-2017-0090589 filed on Jul. 17, 2017 in the Korean Intellectual Property Office. The disclosures of the above-listed applications are hereby incorporated by reference herein in their entirety.

TECHNICAL FIELD

Exemplary embodiments according to the invention relate to a laser reflow apparatus, and more particularly, to a laser reflow apparatus capable of reducing tact time for a single bonding object, accelerating an overall bonding process for all of a plurality of bonding objects, and accelerating a bonding process of a bonding object that needs to be pressurized due to being deposited or severely warped.

BACKGROUND ART

A conventional pressure-type reflow apparatus performs bonding of a thin silicon die to a substrate by brining the silicon die adjacent to a head heated to a predetermined temperature to thereby apply pressure and temperature to the die. This manner involves a one-on-one contact between the head and the silicon die, and the heat is emitted to a lower reflow portion of the silicon die by thermal conduction from the heated head. Accordingly, this type of reflow apparatus requires at least seconds or minutes of thermal conduction time.

Meanwhile, a conventional laser reflow apparatus performs bonding by emitting laser to a bonding object for a few seconds while pressurizing the bonding object. A semiconductor chip or integrated circuit (IC) may be small in size, but has a predetermined size. Such a laser reflow apparatus emits laser in the form of a surface light source corresponding to the size of a semiconductor chip or IC to perform bonding.

Korean Patent Publication No. 10-1245356 (hereinafter, referred to as "prior art document") discloses a pressurizing head of a bonding apparatus using laser in the form of a surface light source. Referring to FIG. 6, it shows a structure of an adsorption module (45) configured to adsorb a semiconductor chip (50) by vacuum and allow laser in the form of a surface light source to be emitted to the semiconductor chip (50), and a pressurizing head (40) comprising the adsorption module.

According to the prior art document, a pressurizing head and a laser emission unit operate as a single integrated module. In the case of bonding a plurality of semiconductor chips such as semiconductor strips, a process of applying heat to a single semiconductor chip and emitting laser in the form of a surface light source needs to be carried out repeatedly as many a time as the number of the plurality of semiconductor chips. Such a mechanism is considered a critical factor in determining an overall operation time for bonding a plurality of semiconductor chips.

In order to reduce the overall operation time, some manufacturers use a bonding apparatus comprising four, and as many as, eight heated heads for conducting simultaneous bonding of a plurality of semiconductor chips. If a great number of heated heads is used, the overall price of bonding apparatus would rise considerably, and therefore, pressure-type reflow apparatus using such heated heads are usually expensive, costing at least KRW 0.8 billion to 2.5 billion.

For these reasons, there is a need for laser reflow apparatus that can significantly lower apparatus price and reduce tact time per die, compared to a conventional heated head method, or a laser-pressurizing-part-integrated head method. Moreover, in the conventional methods, one head can press only one die at a time to apply pressure and heat for reflowing. Therefore, a laser reflow apparatus is needed to maximize productivity by separating a pressurizing unit and a laser emission unit, and emitting laser in the form of a surface light source to a plurality of dies simultaneously after pressurizing the dies. Furthermore, as laser or heat transmission is generally limited by the size of a heated head in conventional methods, a laser reflow apparatus that can use laser beams with various different sizes as a heat source is needed.

The inventor of the present application has discovered that fumes are generated during the process of melting/recoagulation of a soldering material at the time of laser bonding with a substrate being pressurized. It is anticipated that such fumes would act as an element that causes burning as the fumes stick to the bottom surface of the pressurizing object upon laser emission. Thus, in order to improve bonding quality and increase durability of the pressurizing object, a technique for preventing or removing the sticking of the fumes generated upon laser bonding to the bottom surface of the pressurizing object is desired.

A conventional laser reflow apparatus is provided by integrally forming a pressurizing head and a laser emission unit, and thus, has a disadvantage in that the laser emission unit cannot be used once the pressurizing head is damaged. Furthermore, in order to replace the damaged pressurizing head, the integral structure of the pressurizing head and the laser emission unit needs to be disassembled altogether, thereby causing a great waste of time for replacement.

DISCLOSURE OF INVENTION

Problem to be Solved by the Invention

The present invention is conceived to address the aforementioned problems, and exemplary embodiments of the invention provide a laser reflow apparatus that can reduce tact time for a bonding object that needs to be pressurized due to being deposited or severely warped, and accelerate an overall bonding process for all of a plurality of bonding objects.

Additionally, exemplary embodiments of the invention provide a laser reflow apparatus that can improve bonding quality by lessening a loss of laser in the form of a surface light source which is necessary for bonding.

Moreover, exemplary embodiments of the invention provide a laser reflow apparatus that can increase durability of an object for pressurizing a bonding object.

The other objectives of the invention will be more clearly understood from the following detailed description of exemplary embodiments.

Means for Solving Problem

According to an exemplary embodiment of the invention to achieve the aforesaid technical objectives, a laser reflow apparatus includes a bonding object transfer unit configured to transfer a bonding object, the bonding object transfer unit comprising a stage for supporting the bonding object, a laser emission unit configured to emit laser to the bonding object by converting the laser to the form of a surface light source and a laser emission transfer unit configured to transfer the laser emission unit to an emission position or a stand-by position, and a beam transmission plate configured to apply pressure to the bonding object, the beam transmission plate being independently and separately mounted from the laser emission unit and being made of a material transmitting a laser beam in the form of a surface light source, and a beam transmission plate transfer unit configured to transfer the beam transmission plate to an operation position or a stand-by position.

The laser reflow apparatus further includes a protective film transfer unit configured to transfer, underneath the beam transmission plate, a protective film for preventing the fumes generated during laser bonding from sticking to a bottom surface of the beam transmission plate.

The beam transmission plate transfer unit further includes at least one actuator configured to apply pressure to the beam transmission plate, and at least one pressure sensor configured to sense the pressure applied to the beam transmission plate by the actuator. The beam transmission plate transfer unit further includes at least one height sensor configured to sense a height of the beam transmission plate.

The actuator for applying pressure to the beam transmission plate includes at least one pressurizing unit, and using the at least one pressure sensor, performs real-time feedback control and monitoring functions to control the pressure applied to the beam transmission plate.

The actuator for applying pressure to the beam transmission plate includes the height sensor to sense the height at which the pressure is applied and identify the position of the bonding object at the time of bonding the bonding object, and performs the function of maintaining a predetermined height interval with the bonding object.

The beam transmission plate includes a base material selected from the group consisting of quartz, sapphire, fused silica glass, and diamond.

The beam transmission plate includes a thin film coating formed on a bottom surface thereof.

According to an exemplary embodiment of the invention, a beam transmission plate includes a passage on the bottom surface thereof, through which the fumes generated during laser bonding are discharged outwards.

Effect of the Invention

According one or more exemplary embodiments of the laser reflow apparatus configured as above, the following effects can be achieved.

Firstly, by providing a beam transmission plate for pressurizing a bonding object independently from a laser emission unit for emitting laser in the form of a surface light source, the laser emission unit may move to a plurality of positions of the bonding object to emit laser, while the beam transmission plate pressurizing the bonding object, thereby reducing tact time of one bonding object, accelerating an overall bonding process for all of a plurality of bonding objects, and preventing warpage of the bonding object by pressurizing the bonding object that is deposited or severely warped or maintaining a predetermined height of the bonding object.

Additionally, as the beam transmission plate and the laser emission unit are independently provided, if there is a need for replacement, only the beam transmission plate can be rapidly replaced, such that a stand-by time in bonding caused by the replacement of the beam transmission plate can be curtailed, thereby increasing productivity.

Also, as a lower part of the beam transmission plate is protected by a protective film, it can prevent the sticking of the fumes generated upon laser bonding to the bottom surface of the beam transmission plate, thereby improving the bonding quality and enhancing the durability of the beam transmission plate.

Moreover, a beam transmission plate transfer unit may detect the pressure applied to the beam transmission plate and control to maintain a predetermined level in response to a large area pressure and control a height to maintain a predetermined height interval, thereby controlling the flatness between the bonding object and the beam transmission plate to reduce bonding defects.

Furthermore, as a passage is formed on the bottom surface of the beam transmission plate, the fumes generated upon laser bonding can be swiftly discharged through the passage by a suction device above the beam transmission plate.

BRIEF DESCRIPTION OF DRAWINGS

Advantages and features of the invention and methods for achieving them will be made clear from exemplary embodiments described below in detail with reference to the accompanying drawings. The invention may, however, be embodied in many different forms and should not be construed as being limited to the exemplary embodiments set forth herein.

Figure 1:
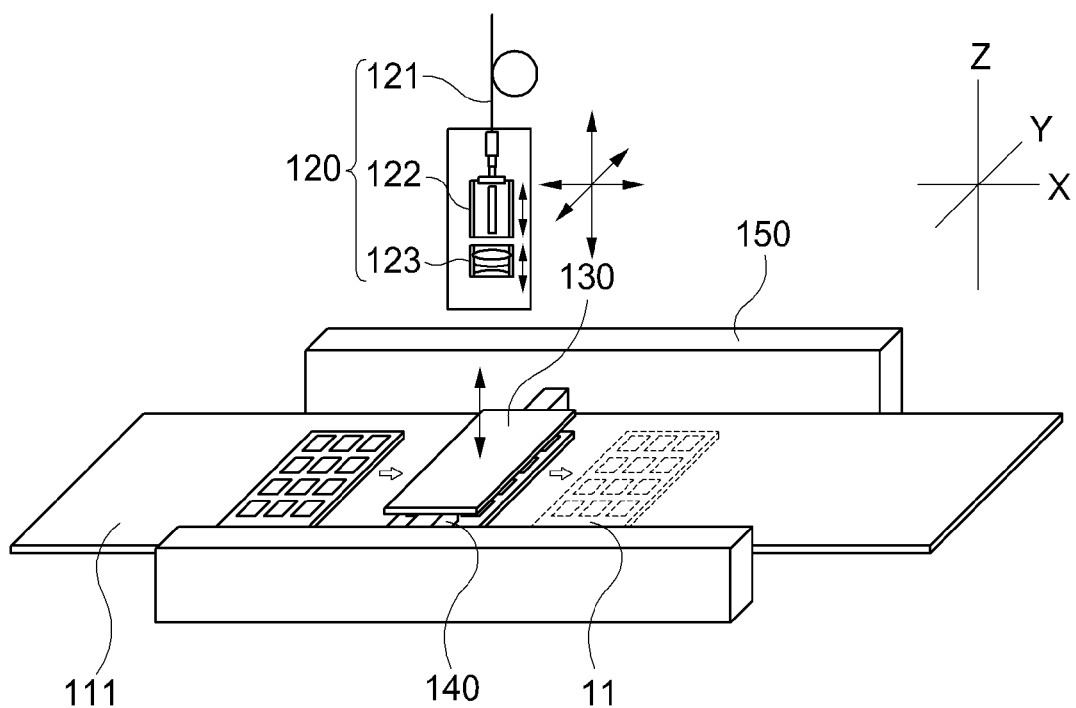
FIGS. 1 and 2 illustrate examples of a laser reflow apparatus according to an exemplary embodiment of the invention.

11: bonding object
111: stage
120: laser emission unit
121: optical fiber
122: beam shaper
123: optical unit
130: beam transmission plate
140: beam transmission plate transfer unit
150: support unit
210: protective film transfer unit
211: protective film

BEST MODE(S) FOR CARRYING OUT THE INVENTION

The terminology used herein is for the purpose of describing particular embodiments only and is not intended to be limiting. As used herein, the singular forms "a," "an," and "the" are intended to include the plural forms, including "at least one," unless the content clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, exemplary embodiments of the invention will be clearly understood from the following description taken in conjunction with the accompanying drawings.

A laser reflow apparatus according to an exemplary embodiment of the invention, as shown in FIG. 1, may comprise a laser emission unit (120) configured to emit laser in the form of a surface light source to a bonding object (11) which is transferred while being supported by a stage (11) comprising a porous material or a vacuum pore having a structure capable of applying heat downwards, a beam transmission plate (130) configured to transmit laser in the form of a surface light source, the beam transmission plate being independently mounted separately from the laser emission unit (120), a beam transmission plate transfer unit (140) configured to move the beam transmission plate (130) to an operation position or a stand-by position, and a support unit (150) configured to movably support the beam transmission plate transfer unit (140).

The laser emission unit (120) converts the laser generated in a laser generator and transmitted through an optical fiber (121) to the form of a surface light source, and emits the laser to the bonding object (11). The laser emission unit (120) may comprise a beam shaper (122) configured to convert laser in the form of a spot to the form of a surface light source, and an optical unit (123) disposed below the beam shaper (122) and comprising a plurality of lens modules mounted in a barrel separately from one another at an appropriate interval to allow the surface light source emitted from the beam shaper (122) to be emitted to an emission area of the bonding object (11).

The laser emission unit (120) may ascend or descend along the z axis, move horizontally along the x axis, or move along the y axis, in order to align with the bonding object (11), and adjust the flatness of the bonding object (11) and the beam transmission plate (130) and the height of the laser emission unit (120).

In the laser reflow apparatus according to an exemplary embodiment of the invention, the beam transmission plate (130) for pressurizing the bonding object (11) is provided independently from the laser emission unit (120) for emitting laser in the form of a surface light source to the bonding object (11), whereby the laser emission unit (120) may move to a plurality of positions of the bonding object (11) to emit laser, while the beam transmission plate (130) pressurizing the bonding object (11). This reduces tact time for a single bonding object (11) and accelerates an overall bonding process for all of a plurality of bonding objects.

The laser reflow apparatus according to an exemplary embodiment of the invention may comprise at least one actuator configured to apply pressure to the beam transmission plate (130), at least one pressure sensor configured to sense the pressure applied to the beam transmission plate (130), and at least one height sensor configured to sense a height of the beam transmission plate. The pressure sensor controls the pressure applied to the bonding object, so that in the case of a large area, multiple actuators and multiple pressure sensors may be employed to control the pressure to be transmitted to the bonding object at an equal level. Moreover, one or more height sensors measure the position value of the height of the bonding object at the time of bonding the bonding object, provide technical data to locate a more precise bonding height, and control a precise height in the case of performing a process requiring a predetermined height interval to be maintained. The pressure sensor may, for example, be provided as one or more load cells. The height sensor may be provided as a linear encoder or a device having a similar function.

The beam transmission plate (130) may comprise a base material that transmits the laser emitted from the laser emission unit (120). The base material of the beam transmission plate (130) may comprise any kind of beam transmissive material. Examples of the beam transmissive material may be selected from the group consisting of quartz, sapphire, fused silica glass or diamond. However, the beam transmission plate comprising quartz has different physical properties from those of the beam transmission plate comprising sapphire. Specifically, in the case of emitting laser of 980 nm, the beam transmission plate comprising quartz has the transmissivity of 85% to 99% and the temperature measured at the bonding object is 100□. Meanwhile, the beam transmission plate comprising sapphire has the transmissivity of 80% to 90% and the temperature measured at the bonding object is 60□.

Thus, in terms of light transmissivity and loss of heat necessary for bonding, quartz exhibits a greater performance than sapphire. However, based on the results of repeated tests run on the beam transmission plate (130) during development of the laser reflow apparatus, the inventor of the present application noticed some problems in the beam transmission plate (130) comprising quartz occurring due to defects in bonding quality as cracks are generated during laser bonding or burning occurs on the bottom surface of the beam transmission plate (130). These problems are attributed to the fumes generated upon laser bonding and sticking to the bottom surface of the beam transmission plate (130), and the heat source of the laser being concentrated on the part where the fumes stick, thereby increasing thermal stress.

In order to prevent damage to the beam transmission plate comprising quartz and increase durability, the beam transmission plate comprising quartz may be formed with a thin coating layer applied on the bottom surface thereof. The thin coating layer formed on the bottom surface of the beam transmission plate may comprise a commonly known optical coating, such as a dielectric coating, SiC coating or metallic coating.

The beam transmission plate transfer unit (140) moves the beam transmission plate (130) to an operation position or a stand-by position. For example, the beam transmission plate transfer unit (140) may lower or lift the beam transmission plate (130), or move the beam transmission plate (130) in a horizontal direction and then lower or lift the beam transmission plate (130).

The beam transmission plate transfer unit (140) may comprise at least one pressure sensor configured to sense the pressure applied to the beam transmission plate (130), and a height sensor configured to sense a height of the beam transmission plate. The pressure sensor may, for example, comprise at least one load cell. The height sensor may comprise a linear encoder.

Figure 2:
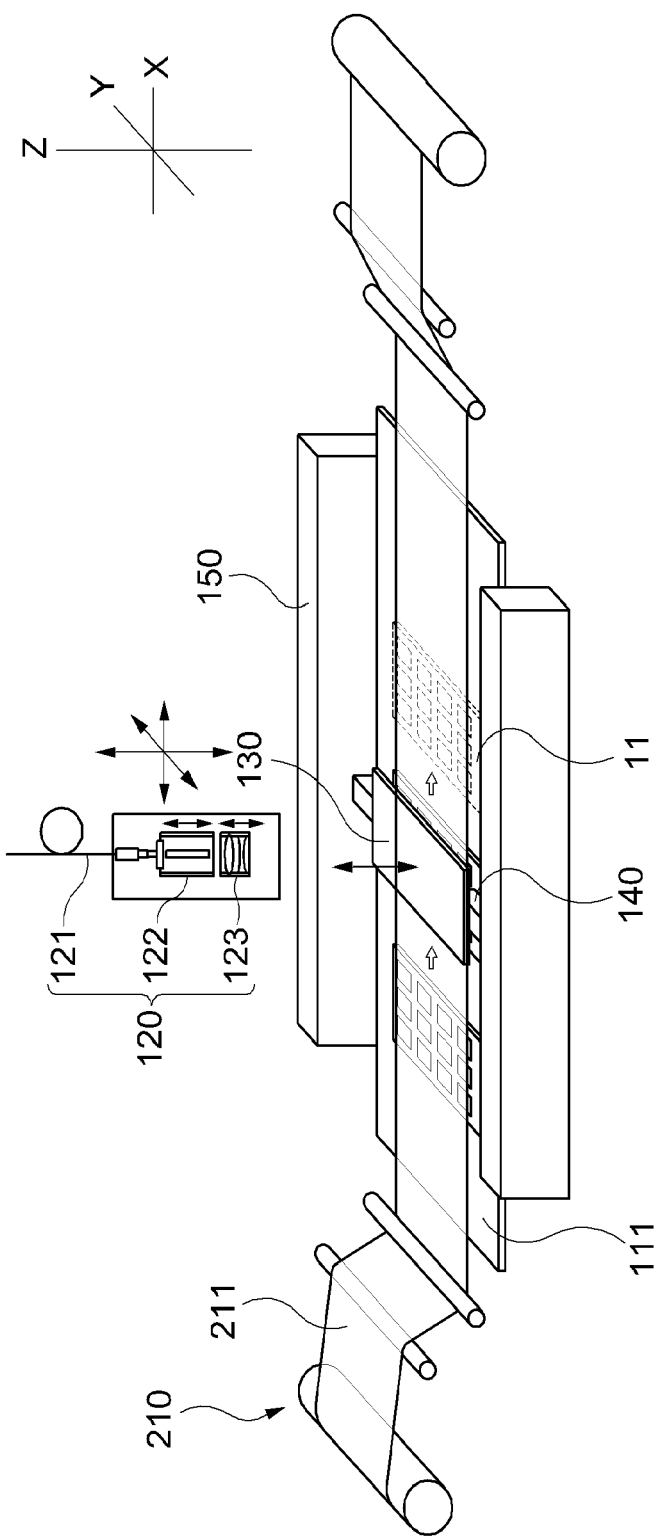

The laser reflow apparatus according to an exemplary embodiment of the invention, as shown in FIG. 2, may further comprise a protective film transfer unit (210) configured to transfer a protective film (211) for preventing the fumes generated upon laser bonding from sticking to the bottom surface of the beam transmission plate (130), underneath the beam transmission plate (130).

The protective film transfer unit (210) may operate in a reel-to-reel scheme in which the protective film wound in a roll type is transferred by unwinding the roll of the film. For example, the protective film (211) may preferably comprise a material with excellent heat resistance, such as those having a maximum operating temperature of 300° C. or more and a maximum continuous operating temperature of 260° C. or more. Examples of the protective film (211) may include polytetrafluoroethylene (PTFE), which is also commonly referred to as a Teflon resin, or a perflouro alkoxy resin. A perfluoro alkylvinylether copolymer (PFA) is a product with improved heat resistance of a fluorinated ethylene propylene resin, and is a highly functional resin having a maximum continuous operating temperature recorded at 260° C., like the PTFE resin.

Figure 3:
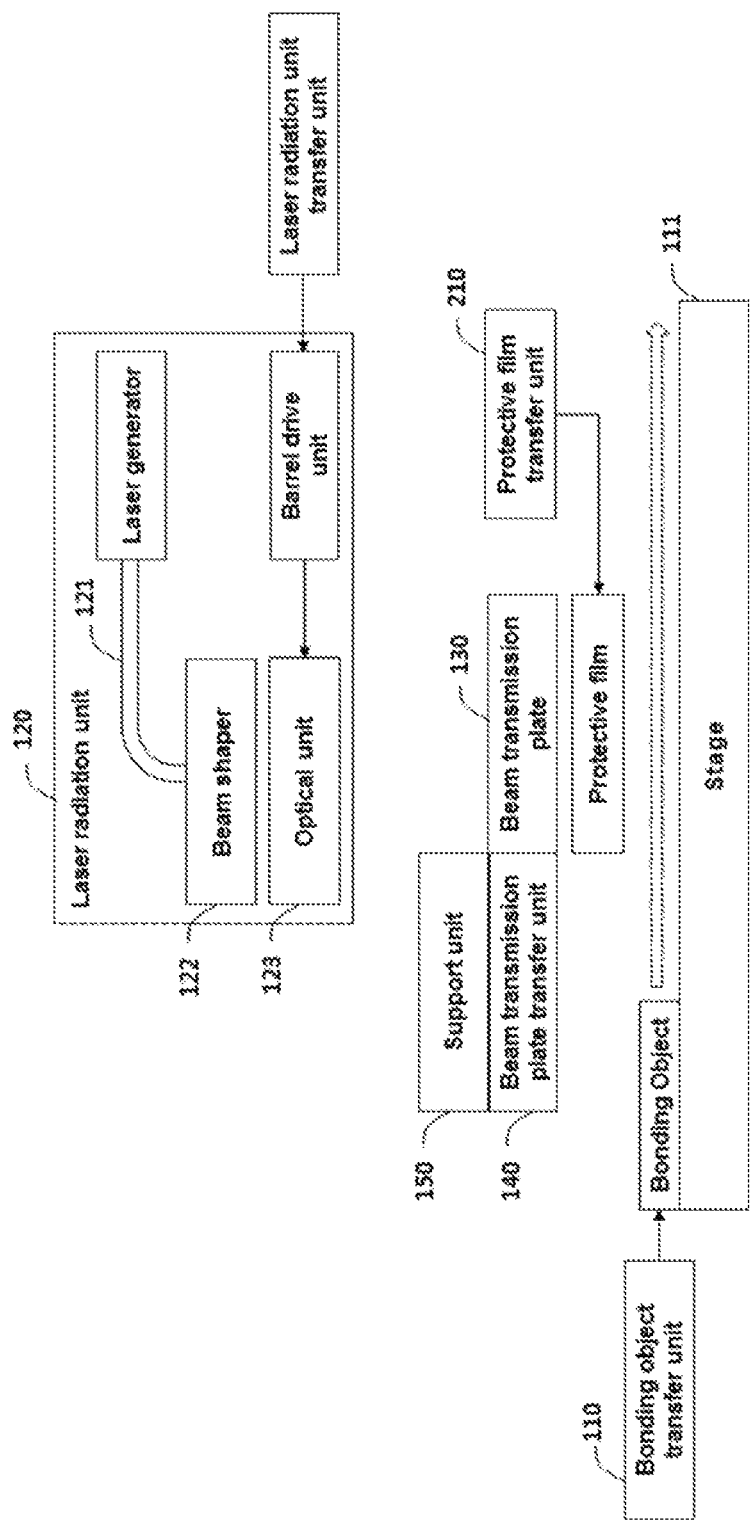
FIG. 3 illustrates a schematic view of an overall configuration of a laser reflow apparatus according to an exemplary embodiment of the invention.

FIG. 3 illustrates a view of an overall configuration of a laser reflow apparatus according to an exemplary embodiment of the invention. Referring to FIG. 3, the laser reflow apparatus according to an exemplary embodiment of the invention may comprise a bonding object transfer unit (110), a laser emission unit (120), a beam transmission plate (130), a beam transmission plate transfer unit (140), a support unit (150) and a protective film transfer unit (210).

The bonding object transfer unit (110) comprises a stage (111) for supporting a bonding object and transfers the bonding object. The stage (111) may comprise a porous material or a vacuum pore having a structure for applying heat downwards. The stage (111) for supporting the bonding object may be provided as a conveyor comprising a plurality of drive rollers that are spaced apart from one another at a predetermined interval, or may be provided as a mechanism to which a precision drive element and a guide are attached, the guide capable of withstanding a high level of pressure. The stage (111) may perform precise positioning to X, Y or Theta according to the type of material.

The laser emission unit (120) converts the laser in the form of a spot that is generated in a laser generator and transmitted through an optical fiber (121) to the form of a surface light source, and emits the laser to the bonding object. The laser emission unit (120) may comprise a beam shaper (122) configured to convert laser in the form of a spot to the form of a surface light source, and an optical unit (123) disposed below the beam shaper (122) and comprising a plurality of lens modules mounted in a barrel spaced apart from one another at an interval to allow the surface light source emitted from the beam shaper (122) to be emitted to the emission area in the bonding object.

The laser emission unit (120) may, for example, further comprise a barrel drive unit configured to adjust ranges of an emission area of a surface light source and a heating temperature by lifting or lowering a plurality of lens modules individually. In this manner, the laser may be selectively emitted to the bonding object for bonding.

Although not shown in FIG. 3, the laser reflow apparatus according to an exemplary embodiment of the invention may comprise a control unit configured to control the operation of the beam transmission plate transfer unit (140) based on data input from the pressure sensor and the height sensor. The pressure sensor and the height sensor may be provided on the stage (11) for supporting the beam transmission plate (130), the beam transmission plate transfer unit (140) and the bonding object. For example, the control unit may control the beam transmission plate transfer unit (140) to reach a target level of pressure based on the data received from the pressure sensor, and also control the beam transmission plate transfer unit (140) to reach a target level of height based on the data received from the height sensor.

The support unit (150) supports the beam transmission plate transfer unit (140) to allow a movement of the beam transmission plate transfer unit (140). For example, the support unit (150) may be provided as a pair of gantries that extend in parallel with the stage (111). However, it should be understood that the support unit (150) comprises a support configuration that enables the beam transmission plate transfer unit (140) to move in the direction of the x-axis, y-axis or z-axis.

Figure 4:
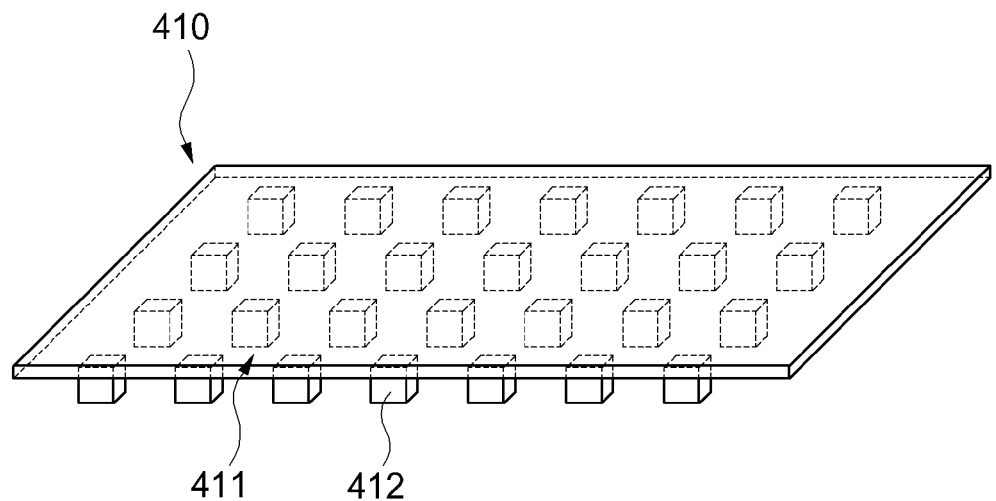
FIG. 4 illustrates a view of a beam transmission plate applicable to a laser reflow apparatus according to an exemplary embodiment of the invention.

FIG. 4 illustrates a view of a beam transmission plate applicable to a laser reflow apparatus according to an exemplary embodiment of the invention. Referring to FIG. 4, a beam transmission plate (410) may comprise a passage (411) on the bottom surface thereof, through which the fumes generated upon laser bonding are discharged outwards. The beam transmission plate (410) may comprise a plurality of protrusions (412) formed on the bottom surface thereof, which are spaced apart from one another at a predetermined interval. The plurality of protrusions (412) may have an embossing shape.

Figure 5:
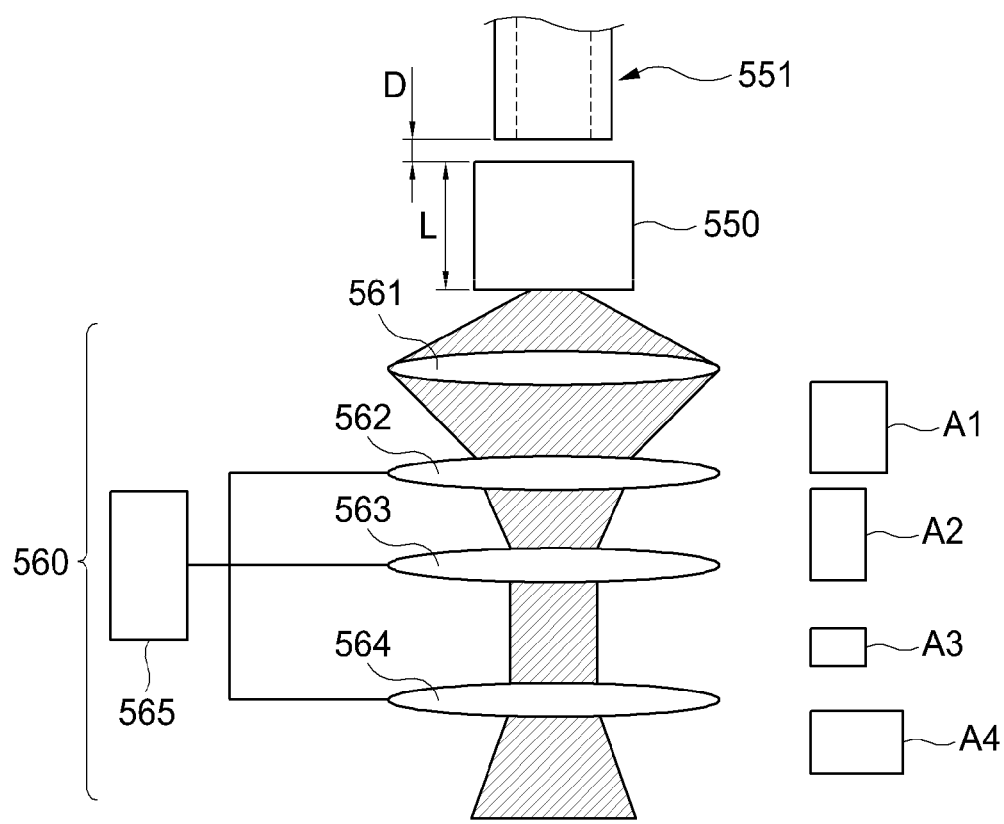
FIG. 5 illustrates an example of a laser emission unit used in a laser reflow apparatus according to an exemplary embodiment of the invention.
Figure 6:
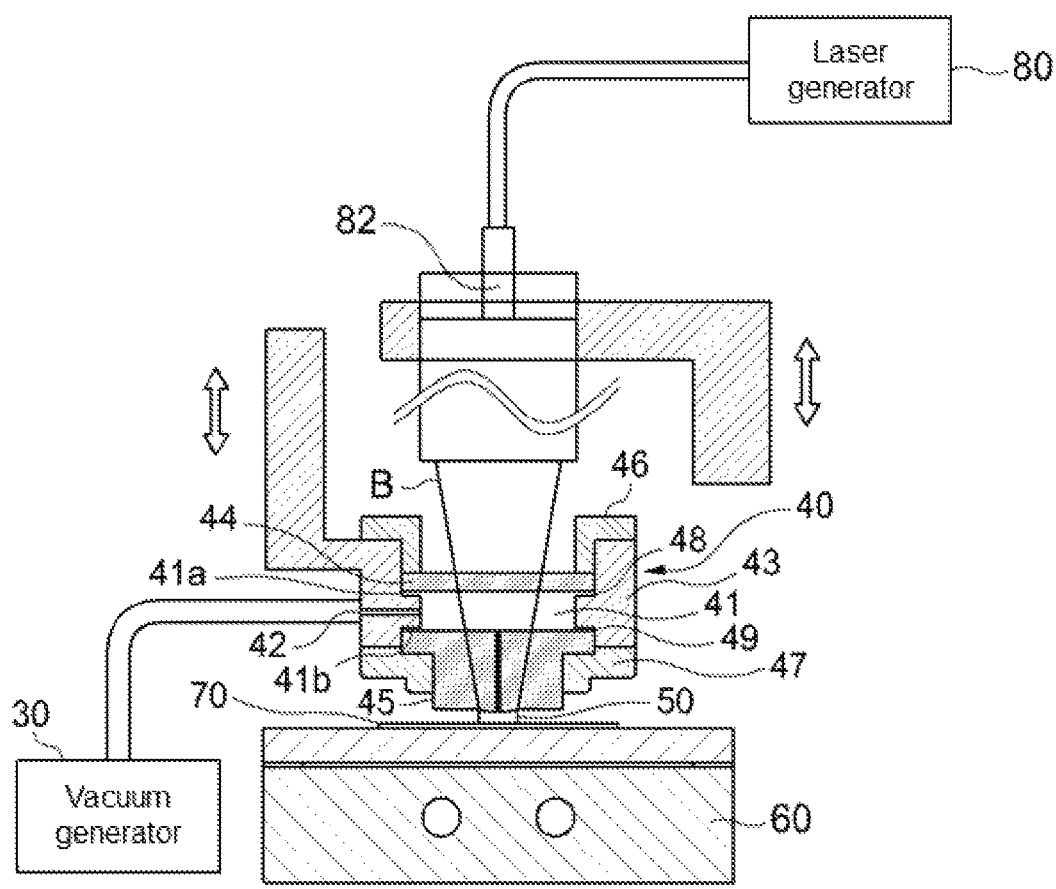
FIG. 6 illustrates a cross-sectional view of a structure of a pressurizing head of a flip-chip bonder according to prior art.

FIG. 5 illustrates an example of a laser emission unit used in a laser reflow apparatus according to an exemplary embodiment of the invention.

According to an exemplary embodiment of the invention, a beam shaper (550) for converting a laser beam in the shape of Gaussian to a surface light source having a uniformized energy distribution. Embodiments of the beam shaper (550) are disclosed in Korean Patent Publication No. 10-1017848. For example, the beam shaper (550) may comprise a square light pipe for forming a square laser uniformized with an optical fiber (551).

Referring to FIG. 5, an optical unit (560) may comprise a convex lens (561), a first cylindrical lens (562), a second cylindrical lens (563) and a focusing lens (564). The optical unit (560) is disposed at an outlet side of the beam shaper (550) and adjusts the size and shape of an emission area of laser. The convex lens (561) may be mounted adjacent to the outlet side of the beam shaper (550) which uniformizes the laser, so as to condense the laser being emitted in the form of a surface. The laser may be dispersed when passing through the outlet side of the beam shaper (550). Therefore, the convex lens (561) condenses the uniformized beam to prevent the dispersion of the beam and transmits the condensed laser to the first cylindrical lens (562). The laser that has passed through the convex lens (561) forms a first emission area (A1).

The first cylindrical lens (562) adjusts the length of the laser that has passed through the convex lens (561) in a first axis direction. The first cylindrical lens (562) may be mounted in the form of a vertically rising cylinder taken along a longitudinal axis, and disposed to allow a convex face of the first cylindrical lens (562) to face upwards, while being disposed below the convex lens (561). The emission area of the laser that passes through the first cylindrical lens (562) may be formed in a manner that the length of the laser in the first axis direction decreases. As the length of the laser that passes through the first cylindrical lens (562) in the first axis direction decreases in the emission area, the emission area may be transitioned from the first emission area (A1) into a second emission area (A2).

The second cylindrical lens (563) adjusts the length of the laser that has passed through the first cylindrical lens (562) in a second axis direction. The length of the laser in the second axis direction is at right angles with the length of the laser in the second axis direction. The second cylindrical lens (563) may have an identical shape to that of the first cylindrical lens (562). The second cylindrical lens (563) may be mounted below the first cylindrical lens (562), disposed to allow a convex face of the second cylindrical lens (563) to face upwards, and disposed to be in right angles with the first cylindrical lens (562). The emission area of the laser that passes through the second cylindrical lens (563) may be formed in a manner that the length of the laser in the second axis direction decreases. As the length of the laser that has passed through the second cylindrical lens (563) in the second axis direction decreases in the emission area, the emission area may be transitioned from the second emission area (A2) into a third emission area (A3).

The first cylindrical lens (562) and the second cylindrical lens (563) may readily adjust the shape of the emission area of the laser. The first cylindrical lens (562) and the second cylindrical lens (563) are not limited to an example, and may comprise any elements capable of readily adjusting the length of the laser in the first axis direction and the second axis direction. The first cylindrical lens (562) and the second cylindrical lens (563) may be disposed to allow a convex face thereof to face downwards, and a lens with a convex upper face may be mounted at the positions of the first cylindrical lens (562) and the second cylindrical lens (563). The emission area of the laser may be adjusted to increase the length in the first axis direction and the length in the second axis direction. The first cylindrical lens (562) and the second cylindrical lens (563) may comprise any examples capable of adjusting a length ratio between the transverse length and the longitudinal length of the emission area by adjusting the length of the emission area in the first axis direction and the length of the emission area in the second axis direction.

The first cylindrical lens (562) and the second cylindrical lens (563) may switch their positions. Specifically, by allowing the laser that has passed through the convex lens (561) to transmit the second cylindrical lens (563) before transmitting the first cylindrical lens (562), the length in the first axis direction may be adjusted after the length in the second axis direction in the emission area is adjusted.

The focusing lens (564) controls the emission area of the laser that has passed through the first cylindrical lens (562) and the second cylindrical lens (563) to have a predetermined surface area. The focusing lens (564) may increase or decrease the surface area of the emission area, while maintaining the shape of the emission area formed by the second cylindrical lens (563). The focusing lens (564) may increase or decrease the surface area of the emission area, in a state where the shape of the emission area is maintained by maintaining a ratio of the length in the second axis direction to the length in the first axis direction in the emission area formed by the first cylindrical lens (563). By expanding the third emission area (A3), which is the emission area of the laser that has passed through the second cylindrical lens (563), using the focusing lens (564), the third emission area (A3) may have a surface area of a fourth emission area (A4). The focusing lens (564) may also reduce the surface area of the third emission area (A3). The focusing lens (564) may be provided as a replaceable element.

From the foregoing, it will be appreciated that various embodiments in accordance with the present disclosure have been described herein for purposes of illustration, and that various substitutions, transformations and modifications may be made without departing from the scope and spirit of the present teachings, which will be clear to one of ordinary skill in the art to which the present invention belongs. Accordingly, the scope of protection sought in the present invention should only be defined by the accompanying claims.

The invention claimed is:

1. A laser reflow apparatus, comprising:
   a bonding object transfer unit configured to transfer a bonding object, the bonding object transfer unit comprising a stage for supporting the bonding object;
   a laser emission unit configured to emit laser to the bonding object by converting the laser to the form of a surface light source and a laser emission transfer unit configured to transfer the laser emission unit to an emission position or a stand-by position;
   a beam transmission plate configured to apply pressure to the bonding object, the beam transmission plate being independently and separately mounted from the laser emission unit and being made of a material transmitting a laser beam in the form of a surface light source, and a beam transmission plate transfer unit configured to transfer the beam transmission plate to an operation position or a stand-by position; and
   a protective film transfer unit configured to transfer, underneath the beam transmission plate, a protective film for preventing fumes generated during laser bonding from sticking to a bottom surface of the beam transmission plate.

2. The laser reflow apparatus according to claim 1, wherein the beam transmission plate transfer unit further comprises:
   at least one actuator configured to apply pressure to the beam transmission plate; and
   at least one pressure sensor configured to sense the pressure applied to the beam transmission plate by the actuator.

3. The laser reflow apparatus according to claim 2, wherein the beam transmission plate transfer unit further comprises at least one height sensor configured to sense a height of the beam transmission plate.

4. The laser reflow apparatus according to claim 1, characterized in that the beam transmission plate comprises a base material selected from the group consisting of quartz, sapphire, fused silica glass, and diamond.

5. The laser reflow apparatus according to claim 4, characterized in that the beam transmission plate comprises a thin film coating formed on a bottom surface thereof.

6. A laser reflow apparatus, comprising:
   a bonding object transfer unit configured to transfer a bonding object, the bonding object transfer unit comprising a stage for supporting the bonding object;
   a laser emission unit configured to emit laser to the bonding object by converting the laser to the form of a surface light source and a laser emission transfer unit configured to transfer the laser emission unit to an emission position or a stand-by position; and
   a beam transmission plate configured to apply pressure to the bonding object, the beam transmission plate being independently and separately mounted from the laser emission unit and being made of a material transmitting a laser beam in the form of a surface light source, and a beam transmission plate transfer unit configured to transfer the beam transmission plate to an operation position or a stand-by position, wherein the beam transmission plate comprises a passage on a bottom surface thereof, through which fumes generated during laser bonding are discharged outwards.

7. The laser reflow apparatus according to claim 6, further comprising:
a protective film transfer unit configured to transfer, underneath the beam transmission plate, a protective film for preventing the fumes generated during the laser bonding from sticking to the bottom surface of the beam transmission plate.

* * * * *